United States Patent
Fukazawa

(10) Patent No.: US 8,563,443 B2
(45) Date of Patent: Oct. 22, 2013

(54) METHOD OF DEPOSITING DIELECTRIC FILM BY ALD USING PRECURSOR CONTAINING SILICON, HYDROCARBON, AND HALOGEN

(75) Inventor: Atsuki Fukazawa, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 13/566,069

(22) Filed: Aug. 3, 2012

(65) Prior Publication Data

US 2012/0295449 A1   Nov. 22, 2012

Related U.S. Application Data

(63) Continuation-in-part of application No. 13/030,438, filed on Feb. 18, 2011, now Pat. No. 8,329,599.

(51) Int. Cl.
*H01L 21/31* (2006.01)
*H01L 21/469* (2006.01)

(52) U.S. Cl.
USPC .............. 438/778; 257/E21.24; 257/E21.233; 257/E21.269; 257/E21.275; 257/E21.277; 257/E21.293; 438/780; 438/781; 438/782; 438/783; 438/786; 438/792; 438/793; 438/794

(58) Field of Classification Search
USPC .............. 257/E21.24, E21.266, E21.269, 257/E21.275, E21.277, E21.293; 438/778–783, 786, 792–794
See application file for complete search history.

(56) References Cited

U.S. PATENT DOCUMENTS

| | | | |
|---|---|---|---|
| 6,528,430 | B2 | 3/2003 | Kwan |
| 2005/0070729 | A1 | 3/2005 | Kiyomori |
| 2010/0041179 | A1 | 2/2010 | Lee |
| 2010/0124618 | A1 | 5/2010 | Kobayashi et al. |
| 2010/0304047 | A1 | 12/2010 | Yang et al. |

OTHER PUBLICATIONS

Non-Final Office Action for U.S. Appl. No. 13/030,438 dated Apr. 4, 2012.
Scientific and Technical Information Center EIC 2800 Search Report dated Feb. 16, 2012.

*Primary Examiner* — Asok K Sarkar
(74) *Attorney, Agent, or Firm* — Snell & Wilmer L.L.P.

(57) ABSTRACT

A method of forming a dielectric film having at least Si—N, Si—C, or Si—B bonds on a semiconductor substrate by atomic layer deposition (ALD), includes: supplying a precursor in a pulse to adsorb the precursor on a surface of a substrate; supplying a reactant gas in a pulse over the surface without overlapping the supply of the precursor; reacting the precursor and the reactant gas on the surface; and repeating the above steps to form a dielectric film having at least Si—N, Si—C, or Si—B bonds on the substrate. The precursor has at least one Si—C or Si—N bond, at least one hydrocarbon, and at least two halogens attached to silicon in its molecule.

16 Claims, 6 Drawing Sheets

METHOD OF DEPOSITING DIELECTRIC FILM BY ALD USING PRECURSOR CONTAINING SILICON, HYDROCARBON, AND HALOGEN

CROSS-REFERENCE TO RELATED APPLICATIONS

This application is a continuation-in-part of U.S. patent application Ser. No. 13/030,438, filed Feb. 18, 2011, the disclosure of which is herein incorporated by reference in its entirety. The applicant(s) herein explicitly rescind(s) and retract(s) any prior disclaimers or disavowals made in any parent, child or related prosecution history with regard to any subject matter supported by the present application.

BACKGROUND

1. Field of the Invention

The present invention relates generally to semiconductor integrated circuit manufacturing and, more particularly to a method of forming a dielectric film having at least Si—N, Si—C, or Si—B bonds on a semiconductor substrate by atomic layer deposition (ALD).

2. Description of the Related Art

SiC, SiCN, SiCO and other silicon carbide insulation films were adopted as etching stopper films and Cu diffusion blocking films for devices installed with Cu wirings. These films provided advantages in that their film characteristics could be changed by controlling the ratios of carbon, nitrogen and oxygen and that these films offered insulation resistance despite being thin and also allowed for control of dielectric constant at low levels. Those skilled in the art have been forming these silicon carbide films using plasma CVD, where the step covering property (coverage) with these films formed on semiconductor circuits having irregular surfaces has been approx. 70%. On the other hand, the aspect ratio, which represents the ratio of depth to opening width, has increased in line with the trend for finer wiring patterns and the coverage of film itself is expected to decrease further, and this expectation has given rise to the need to examine technologies to form films using atomic layer deposition (ALD) generally associated with better coverage. Behind this need is an increasing demand for formation of films on semiconductor circuits having irregular surfaces of high aspect ratios.

As insulation film forming technologies based on ALD, those for SiO and SiN have been common. While the SiO process involving oxidizing replacement is basically insensitive to effects of temperature, etc., and thus can be performed at relatively low temperatures to form film, the SiN process requires high temperatures for film to be formed because nitriding replacement does not occur easily due to the skeleton of the material used in this process, and as wiring patterns become finer, drop in replacement efficiency in the pattern and other undesirable outcomes lead to varying film qualities at different parts of the pattern as well as poor coverage.

In the ALD-based SiO process, in many cases aminosilane material is used as a precursor, while oxidizing gas is used as a reactant gas, to form SiO film of good quality. On the other hand, when the inventors of the present invention formed SiN film through the ALD-based SiN process using aminosilane material as a precursor and nitrogen gas such as $N_2$ or $NH_3$ as a reactant gas, and evaluated the formation of film, it was confirmed that the content of residual carbon in SiN film increased. In other words, despite its name of "SiN" the film contained a significant amount of carbon and other elements, and SiN film constituted virtually by Si, N and H was not formed. Since one likely reason for this residual carbon in SiN film is low nitriding efficiency, it is necessary to improve the process material before we can form SiN film containing less residual carbon.

As discussed above, the present inventors have recognized several problems in formation of a SiN film by ALD and developed solutions thereto, which solutions can also be applicable to formation of other types of film such as SiC, SiCN, SiBN, and SiBCN. Thus, the present invention relates to improvement on formation of films having Si—N, Si—C, and/or Si—B bonds.

Any discussion of problems and solutions involved in the related art has been included in this disclosure solely for the purposes of providing a context for the present invention, and it should not be taken as an admission that any or all of the discussion were known at the time the invention was made.

SUMMARY

An embodiment of the present invention provides a method of forming a dielectric film having at least Si—N, Si—C, or Si—B bonds on a semiconductor substrate by atomic layer deposition (ALD), which comprises: (i) supplying a precursor in a pulse to adsorb the precursor on a surface of a substrate loaded in a reactor, said precursor having at least one (e.g., any integer of 1 to 3) Si—C or Si—N bond, at least one hydrocarbon, and at least two halogens (e.g., any integer of 2 to 6) attached to silicon in its molecule; (ii) supplying a reactant gas in a pulse over the surface, wherein the supply pulse of the precursor and the supply pulse of the reactant gas do not overlap with each other; (iii) reacting the adsorbed precursor with the reactant gas on the surface by applying RF power in a pulse to the reaction gas during step (ii); and (iv) repeating steps (i) to (iii) to form a dielectric film having at least Si—N, Si—C, or Si—B bonds on the substrate.

In some embodiments, the precursor has a general formula:

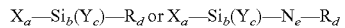

$$X_a\text{—}Si_b(Y_c)\text{—}R_d \text{ or } X_a\text{—}Si_b(Y_c)\text{—}N_e\text{—}R_d$$

wherein each X is attached to silicon and is independently selected from the group consisting of H, F, Cl, I, and Br, each Y bonds two silicones and is independently selected from the group consisting of $CH_2$, $C_2H_4$, NH, $NCH_2$, and NCl, each R is attached to silicon or nitrogen and is independently selected from the group consisting of $CH_3$, $C_2H_5$, $C_3H_7$, $C(CH_3)_3$, $NH_2$, and $CH_2Cl$, each N in the general formula is attached to silicon, and a, b, c, d, and e are integers.

By using the above precursors, replacement reaction such as carbonization and nitridation can substantially be improved, thereby enabling the formation of a film having desired components without substantial contamination and having high conformality (e.g., at least about 90%, or at least about 95%) even for an irregular surface having an aspect ratio of about one or higher (e.g., about 1 to about 10, or about 2 to about 5).

By separating the supply pulse of the precursor and the supply pulse of the reactant gas, generation of particles can be suppressed. In some embodiments, further by applying RF power after stabilizing the flow rate of the reactant gas, growth rate per cycle can be improved.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

DETAILED DESCRIPTION

Figure 1:
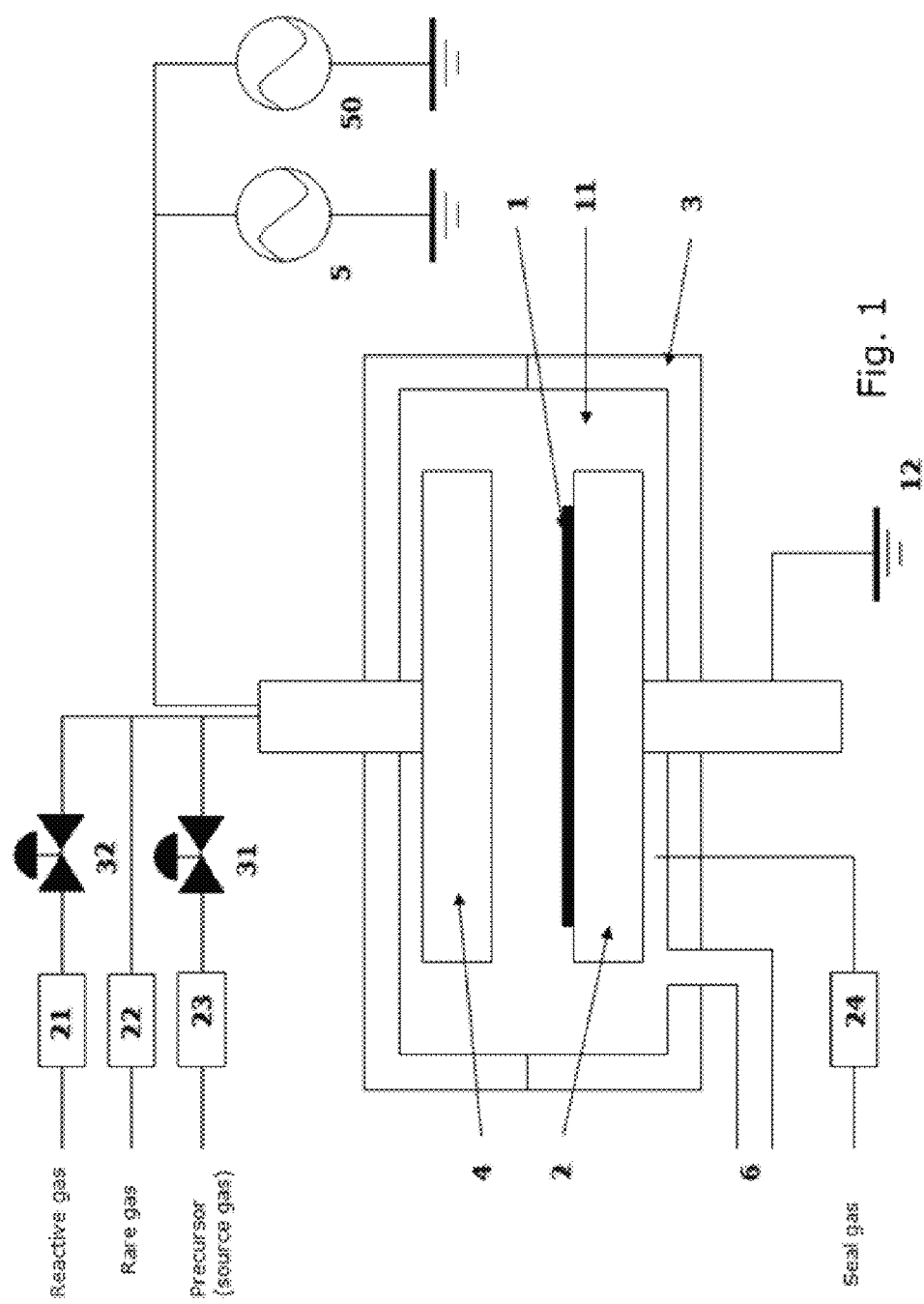
FIG. 1 is a schematic representation of a PEALD apparatus for depositing a dielectric film usable in some embodiments of the present invention.

In this disclosure, "gas" may include vaporized solid and/or liquid and may be constituted by a mixture of gases. In this disclosure, "having Si—N bonds" may refer to being characterized by Si—N bonds, being constituted mainly or predominantly by Si—N bonds, being categorized in Si—N films, and/or having a main skeleton substantially constituted by Si—N bonds. Also, "having Si—C bonds" and "having Si—B bonds" may be defined likewise. In this disclosure, the precursor may include a rare gas as a carrier gas when the precursor is vaporized and carried by a rare gas, and the flow of the precursor is controlled by the inflow pressure (the pressure of gas flowing into a reactor). Further, the precursor is a precursor containing silicon and can be mixed with a secondary precursor which does not contain silicon such as hydrocarbon gas for a film having Si—C bonds. The reactant gas is any gas other than rare gas and supplied separately from the precursor at a different timing, regardless of whether the reactant gas causes reaction with the precursor. In some embodiments, no oxygen-containing gas, oxidant gas, oxygen-supplying gas, or oxidizing gas is used during film formation steps. In some embodiments, the reactant gas also functions as a purge gas when the reactant gas is continuously introduced. Further, in this disclosure, any two numbers of a variable can constitute an applicable range of the variable, and any ranges indicated may include or exclude the endpoints. In the above, "continuously" refers to without breaking a vacuum, without interruption as a timeline, without changing treatment conditions, immediately thereafter, as a next step, or without a discrete physical or chemical boundary between two structures in some embodiments. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, any defined meanings do not necessarily exclude ordinary and customary meanings in some embodiments.

In the disclosure, "substantially smaller", "substantially different", "substantially less" or the like refers to a difference of at least 1%, 5%, 10%, 20%, 30%, 40%, 50%, 60%, 70%, 80%, or any ranges thereof, for example. Also, in the disclosure, "substantially the same", "substantially uniform", or the like refers to a difference of less than 10%, less than 5%, less than 1%, or any ranges thereof, for example.

As described above, in some embodiments, the precursor has a general formula:

wherein each X is attached to silicon and is independently selected from the group consisting of H, F, Cl, I, and Br, each Y bonds two silicones and is independently selected from the group consisting of $CH_2$, $C_2H_4$, NH, $NCH_2$, and NCl, each R is attached to silicon or nitrogen and is independently selected from the group consisting of $CH_3$, $C_2H_5$, $C_3H_7$, $C(CH_3)_3$, $NH_2$, and $CH_2Cl$, each N in the general formula is attached to silicon, and a, b, c, d, and e are integers. In some embodiments, the precursor is the only gas which contains silicon.

In some embodiments, the precursor is at least one compound selected from the group consisting of:

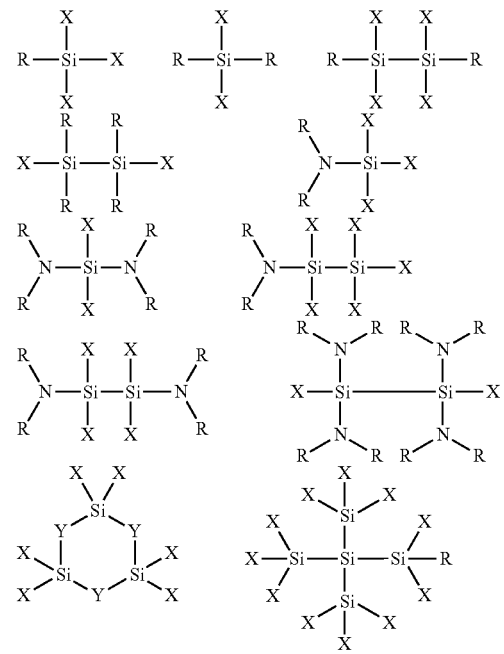

-continued

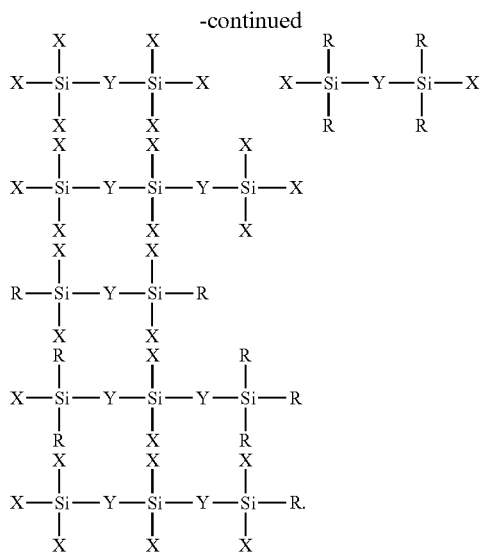

In some embodiments, in the general formula, the number of X's is ½ or more (e.g., ⅔ or more, ¾ or more) of the number of Y's and R's in total.

In some embodiments, the dielectric film is formed by steps comprising: (i) adsorbing a precursor on a surface of a substrate, said precursor having at least one Si—C or Si—N bond, at least one hydrocarbon, and at least one halogen attached to silicon in its molecule; (ii) supplying a reactant gas over the surface; (iii) reacting the precursor and the reactant gas on the surface; and (iv) repeating steps (i) to (iii) to form a dielectric film having at least Si—N, Si—C, or Si—B bonds on the substrate.

In some embodiments, the dielectric film is constituted by SiN, SiCN, SiC, SiBN, or SiBCN, typically SiN or SiCN. In some embodiments, the dielectric film is constituted by SiN, SiCN, or SiC, and the reactant gas is selected according to the type of the dielectric film and is at least one selected from the group consisting of $N_2$, $NH_3$, $N_xH_y$, $N_xH_yC_z$, $C_aH_b$, $C_aF_b$, $C_aH_bN_c$, and $H_2$ wherein x, y, z, a, b, and c are integers (e.g., x is one or two, and a is three to six). In some embodiments, the dielectric film is constituted by SiBN or SiBCN, and the reactant gas is at least one selected from the group consisting of $B_xH_y$ and $B_xH_yC_z$ wherein x, y, and z are integers (e.g., x is one or two).

In some embodiments, a supply pulse of the precursor is not overlapped by a supply pulse of the reactant gas. In some embodiments, a supply pulse of the precursor is overlapped by a supply pulse of the reactant gas.

In some embodiments, in step (iii), the reaction between the precursor and the reactant gas is accomplished by applying RF power to the reactant gas while the precursor is not supplied.

In some embodiments, the dielectric film is composed of at least three elements including silicon, and in step (ii), the reactant gas is comprised of at least first and second reactant gases which are discrete and contain different elements and are supplied sequentially wherein a supply pulse of the first reactant gas and a supply pulse of the second reactant gas do not overlap each other. In the above, in some embodiments, in step (iii), the reaction between the precursor and the first and second reactant gases is accomplished by applying RF power to the first and second reactant gases only while each first and second reactant gases are supplied. Alternatively, in some embodiments, in step (iii), the reaction between the precursor and the first and second reactant gases is accomplished by applying RF power to the first and second reactant gases only while the second reactant gas is supplied.

In some embodiments, the dielectric film is composed of at least three elements including silicon, and in step (ii), the reactant gas is comprised of at least first and second reactant gases which are discrete and contain different elements and are supplied sequentially wherein a supply pulse of the first reactant gas and a supply pulse of the second reactant gas overlap each other. In the above, in some embodiments, in step (iii), the reaction between the precursor and the first and second reactant gases is accomplished by applying RF power to the second reactant gases while neither the precursor nor the first reactant gas is supplied, and the second reactant gas is supplied.

In some embodiments, any of the foregoing methods further comprises treating the dielectric film with a plasma after step (iv). In the above, in some embodiments, the plasma is a N-containing gas plasma, a reduction gas plasma, and/or a rare gas plasma. Also, in the above, in some embodiments, the plasma is generated by applying RF power having a frequency of 400 kHz to 60 MHz (e.g., 10 MHz to 30 MHz) to a plasma-generating gas supplied over the substrate at a temperature of the substrate of about 0° C. to about 650° C. (e.g., about 50° C. to about 450° C.).

In some embodiments, in step (i), the substrate has a copper layer as an outmost layer on which the precursor is adsorbed, wherein the dielectric film is formed as a copper diffusion blocking layer.

In some embodiments, the substrate is maintained at a temperature of about 0° C. to about 400° C. The Si-containing precursor may be composed of a combination of silicon and hydrogen, a combination of silicon, hydrogen, and nitrogen, or a combination of silicon, hydrogen, carbon, and nitrogen.

In some embodiments, the vaporized Si-containing precursor may be introduced in pulses of duration of approximately 0.1 sec to approximately 1.0 sec. After introducing the Si-containing precursor, a plasma may be excited in pulses of duration of approximately 0.1 sec to approximately 1.0 sec and then an interval step is carried out using the reactive gas for approximately 0.1 sec to approximately 1.0 sec without introducing the Si-containing precursor and without the existing of plasma. In some embodiments, the reaction gas may be a combination of nitrogen gas and hydrogen gas or a combination of ammonia gas and hydrogen gas. In some embodiments, the rare gas may be selected from the group consisting of He, Ar, Kr, Xe, and the molar flow rate of the rare gas may be greater than the molar flow rate of the Si-containing source. In some embodiments, the reaction chamber may be maintained at a pressure of about 0.1 Torr to about 10 Torr. In some embodiments, RF power may be between approximately 0.02 W/cm$^2$ and approximately 2.0 W/cm$^2$.

Efficiency of nitriding replacement using plasma at low temperature (approx. 450° C. or below, such as 50 to 400° C.) is affected significantly by the skeleton of the process material, in that nitriding replacement requires the skeleton of hydrogen or chlorine having a direct bond with silicon being the target of replacement, and therefore in an embodiment this nitriding efficiency will drop considerably unless the number of X indicating hydrogen or halogen in a chemical formula is at least one half that of Y and R indicating a carbon unit or nitrogen unit, in which case the uniformity of film quality and coverage over the pattern will also drop. By using a silicon process material expressed by an appropriate chemical formula considering the above points and $NH_3$, hydrazine, etc., is used to implement nitriding, SiN film offering excellent step covering property can be formed. Improvement of nitriding efficiency is possible by controlling the bonding reaction, in the process material, between a hydrocarbon and a reaction group having a direct bond with Si.

When a conventional aminosilane precursor is used to form SiN film by plasma ALD, nitriding efficiency and RI value become low and coverage is also kept at 70% or so. If a precursor having chlorine or other type of halogen is used to form SiN film by plasma ALD, on the other hand, nitriding efficiency improves, RI value rises, and coverage also becomes better.

If all bonds with Si are with chlorine or a combination of chlorine and hydrogen, then forming SiN film using, say, $Si_2Cl_6$, causes a lot of secondary products to form in the film, while lowering the film forming temperature prevents ammonium chloride from sublimating and causes it to remain on the wafer as particles. On the other hand, use of $SiH_4$ as a precursor in the formation of SiN film is possible depending on the substrate material, but such method would result in slow growth of film and consequently poor production efficiency.

Film can also be formed by thermal ALD instead of plasma ALD, but plasma ALD is preferred in terms of productivity because thermal ALD requires a longer time for replacement reaction. Also, thermal reaction exhibits marked dependence on temperature and implementing it at low temperatures is difficult. Note that plasma ALD and thermal ALD are interchangeable in an embodiment despite their differences in productivity, etc.

When forming SiCN or other film having three or more constituent elements, in an embodiment the film forming sequence is modified from the one used for SiC or SiN to add one more constituent element. In one method, a silicon process material is adsorbed, purge is performed, and then a hydrocarbon material is introduced, followed by application of RF pulses (nitriding and carbiding occur simultaneously), while in another method nitriding and carbiding are implemented separately by applying RF pulses in two stages. In both methods, SiCN, etc., can be formed. When forming silicon insulation film constituted by multiple elements, RF pulses can be applied in multiple steps or additive gas can be introduced after the process material adsorption process to permit doping control. Process controls such as those mentioned above allow for formation of SiN and SiCN in desired manners, respectively, and prevent the traditional problem of the resulting film containing carbon and becoming SiCN instead of the target SiN.

As for SiC film, although the material had been considered to be very difficult to deposit by ALD, in an embodiment it is possible to form SiC film by using $H_2$ as a reactant gas when RF pulses are applied. By using $H_2$, the Si—C skeleton of the process material can be maintained and film whose basic skeleton is Si—C can be deposited by ALD. If an extremely high carbon concentration (such as 30 atomic % or more) must be achieved, in an embodiment hexane or other hydrocarbon gas (especially gas with 3 or more carbons) can be used as a reactant gas to enable deposition of film by ALD. The foregoing can be implemented using any film forming process sequence disclosed so far, but those skilled in the art can modify any such known sequence in an appropriate manner.

In an embodiment of the present invention, SiN, SiCN or SiC insulation film can be formed by ALD, while effectively preventing mixing-in of other elements, through optimization of the silicon process material. By using as a precursor a material containing hydrocarbon bonds, it becomes possible to select conditions and perform replacement using the same precursor, and formation of various insulation films such as SiN, SiCN and SiC also becomes possible through optimization of the reactant gas. If boron material is used as a reactant, SiBN, SiBCN and other boron insulation films can be formed, which helps expand the formation technologies to achieve insulation films offering superior step covering property.

Also note that, in an embodiment, post-treatment is performed after the film forming process for the purpose of protecting the film surface and removing impurities, which is effective in improving film density and resistance to chemical solutions. This post-treatment is not mandatory, but performing it makes the film more resistant to integration and other forms of additional processing.

Embodiments disclosed herein include, but are not limited to, those listed below:

1) A method of forming a film based on plasma or thermal atomic layer deposition (ALD) implemented at a susceptor temperature of 0 to 650° C., which is characterized in that the material (precursor) for forming film with SiN, SiCN, SiC, SiBN, SiBCN, etc., has a Si—C or Si—N bond. Such method is also characterized in that, in consideration of adsorption reaction and efficiency of replacement with reactant gas, the material has a bond of Si and hydrogen or halogen and is expressed by the following general formula, where at least one Y or one R is a hydrocarbon and at least one X is a halogen element:

$X_a$—$Si_b(Y_c)$—$R_d$ or $X_a$—$Si_b(Y_c)$—$N_e$—$R_d$ (In the formula, X is an element bonding with Si, Y is a bonding group inter-connecting Si and Si, R is a reaction group bonding with Si, and a, b, c and d are whole numbers.)

2) A method according to 1) above, characterized in that the basic skeleton and reaction group of the material are expressed by one of the chemical formulas disclosed in this Specification. X is independently H, F, Cl, I or Br, Y is independently $CH_2$, $C_2H_4$, NH, NCH, or NCl, and R is independently $CH_3$, $C_2H_5$, $C_3H_7$, $C(CH_3)_3$, $NH_2$ or $CH_2Cl$.

3) A method according to 1) above, characterized in that plasma processing is performed as post-treatment after the completion of film forming by ALD, or incorporated in the ALD process sequence, to improve density, remove impurities from the film and also stabilize the state of Si bonds. Such method is also characterized in that the gas used for plasma processing is one gas or a combination of two or more gases selected from $N_2$, $NH_3$, hydrazine and other nitriding gases, $H_2$ and other reducing gases, and He, Ar and other inert gases (rare gases). Such method is also characterized in that two or more types of plasma processing using gas, selected from nitriding gas processing, reducing gas processing and inert gas processing, are combined.

4) A method according to 3) above, characterized in that the frequency of plasma to be used is selected from 400 kHz to 60 MHz, while the substrate temperature is controlled within a range of 0 to 650° C.

5) A method according to 1) above, characterized in that the gas used for nitriding, carbiding or carbon nitriding (by means of RF pulse application or heat treatment) after adsorption of precursor for the purpose of forming SiC, SiCN or SiN is as follows:

Nitriding: $N_2$, $NH_3$, NxHy (hydrazine), NxHyCz (monomethyl hydrazine)

Carbiding: CxHy, CxFy, CxHyNz, $H_2$

6) A method according to 5) above, characterized in that, to form SiCN, a multi-stage RF pulse application step is used where RF pulse application is performed in two stages to implement nitriding and carbiding under separate applications of RF pulses, or the hydrocarbon material is introduced after adsorption of precursor and then nitrided by applying RF pulses or under heat treatment.

7) A method according to 1) above, characterized in that, to form boron-containing insulation film having a film composition of SiBN, SiBCN, etc., a gas expressed by the chemical formula of BxHy or BxHyCz is used in the RF pulse application step or heat treatment step after adsorption of precursor.

8) A method according to 7) above, characterized in that, to form SiBN or SiBCN, a multi-stage RF pulse application step is used to repeat nitriding and carbiding alternately (the following four steps are repeated in this order: adsorption of precursor→purge→nitriding by RF pulses→carbiding by RF pulses) or the hydrocarbon material is introduced after adsorption of precursor and then nitrided by applying RF pulses or under heat treatment (the following four steps are repeated in this order: adsorption of precursor→purge→adsorption of hydrocarbon material→nitriding by RF pulses).

In some embodiments, in step (ii), the supply pulse of the precursor and the supply pulse of the reactant gas do not overlap with each other, and the method further comprises purging the reactor between steps (i) and (ii) and between steps (iii) and (iv) so as to effectively avoid contacting the precursor and the reactant gas. As illustrated in the examples described later, when forming, for example, a SiN or SiCN film by PEALD using a halogen-containing precursor and a reactant gas such as NH3, if the precursor and the reactant gas are in contact with each other in the reactor (e.g.; the supply pulse of the precursor and the supply of the reactant gas overlap with each other, e.g., the latter is continuously supplied), generation of particles accumulated on the surface of the substrate becomes significant. For example, the number of particles observed on the surface of the substrate may be several hundreds to several thousands. The number of particles is correlated with the flow rate of the reactant gas, and when the flow rate of the reactant gas increases, the number of particles increases. This problem may be unique to the use of a halogen-containing precursor. The particles may be generated where the precursor flow and the reactant gas flow meet and react in the supply lines and in the interior of the reactor. Due to the reaction between the precursor and the reactant gas in the supply lines and in the interior of the reactor before reaching the surface of the substrate and reacting thereon, the growth per cycle (GPC) of the depositing film becomes low, e.g., about 0.01 to about 0.03 nm/cycle, although the step coverage and film quality are excellent. By separating the supply pulse of the precursor and the supply pulse of the reactant gas so that the precursor and the reaction gas are not mixed and reacted in the supply lines and in the interior of the reactor, the number of particles on the surface of the substrate can significantly be decreased independent of the flow rate of the reactant gas, e.g., about 50 or less, and further, GPC can increase to, e.g., about 0.04 to about 0.06 nm/cycle.

The number of particles can be determined using a particle counter using a laser having a wavelength of 633 nm, such as a SP1 manufactured by KLA-Tencor Corporation, which shows particles as dots distributed on the surface.

In some embodiments, in step (iii), RF power is applied after stabilizing a flow (e.g., the flow rate) of the reactant gas in step (ii). By applying RF power after the flow of the reactant gas is stabilized, a stable state of plasma or remote plasma can be maintained, improving GPC and film quality. In some embodiments, in step (ii), a first time period between starting the supply of the reactant gas and starting the application of RF power is longer (e.g., at least 20%, 50%, 100% longer) than a second time period between starting the application of RF power and ending the application of RF power. In some embodiments, the first time period is longer (e.g., at least 20%, 50%, 100%, 200% longer) than the time period of the supply pulse of the precursor. In some embodiments, the first time period is about 2.3 seconds to about 8 seconds, and the second time period is about 0.3 seconds to about 5 seconds. In some embodiments, the reactant gas is supplied to the reactor via a mass flow controller (MFC), and the time period for stabilizing the flow depends on the characteristics of the MFC, gas flow in the reactor, exhaust, etc. When the MFC receives a signal to initiate gas flow at a predetermined rate, the MFC compares the current gas flow rate and the desired gas flow rate, and adjusts a voltage applied to a valve drive, and thus, it takes, for example, about 1 to 3 seconds to stabilize the flow (in the above embodiment, about 2.3 to about 8 seconds, in another embodiment, about 1.1 to about 20 seconds). A skilled artisan can determine the time period required to stabilize the flow using a graph illustrating the relationship between the voltage applied to the MFC valve drive and the time upon startup of a gas process (e.g., FIGS. 2 and 5 of U.S. Patent Publication No. 2002/0189681, the disclosure of which is incorporated herein in its entirety) based on routine experimentation, where the flow becomes stable when the voltage becomes stable.

In some embodiments, a temperature of the substrate is controlled at room temperature to 550° C. In some embodiments, nitrogen and/or rare gas is/are continuously supplied throughout steps (i) to (iv) in order to promote nitrization of the film.

Embodiments are explained with reference to the drawings which are not intended to limit the present invention. FIG. 1 is a schematic view of a plasma-enhanced ALD reactor with flow control valves, which can be used in some embodiments of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz~500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and a precursor is introduced into the reaction chamber 3 through a gas flow controller (MFC) 23, a pulse flow control valve 31, and the shower plate. Likewise, a reactant gas (reactive gas) is introduced into the reaction chamber 3 through a gas flow controller (MFC) 21, a pulse flow control valve 32, and the shower plate. A rare gas or inactive gas or dilution gas is introduced into the reaction chamber 3 through a gas flow controller (MFC) 22 and the shower plate. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). For the pulse flow control valves 31 and 32, a pulse supply valve that is used for ALD can suitably be used in some embodiments.

Figure 5:
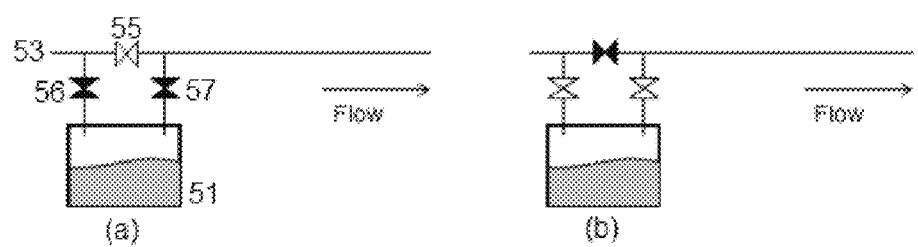
FIG. 5 illustrates a schematic view of a switching flow control system usable in an embodiment of the present invention.

In the above, the precursor is supplied with a carrier gas in pulses using the MFC 23 and the pulse flow control valve 32. However, a carrier gas can continuously be supplied while pulsing the flow of the precursor. FIG. 5 illustrates such a method. By switching a precursor flow and a carrier gas flow while maintaining the same flow rate, precursor supply is controlled as illustrated in FIG. 5. In the switching flow control system, a liquid precursor is vaporized in a tank 51, a carrier gas is introduced into the tank 51 through a line 53 via a valve 56 since a valve 55 is closed. The carrier gas carries the vaporized precursor and flows out together from the tank 51 through a line 54 via a valve 57 as illustrated in (b) in FIG. 5. However, when the valve 55 is open, and the valves 56, 57 are closed, only the carrier gas flows through the lines 53, 54 as illustrated in (a) in FIG. 5. By switching a precursor and a carrier gas flow, a total flow rate and an RC pressure can substantially be fixed and an RC pressure is easily controlled by an automatic pressure controller (not shown).

Figure 2:
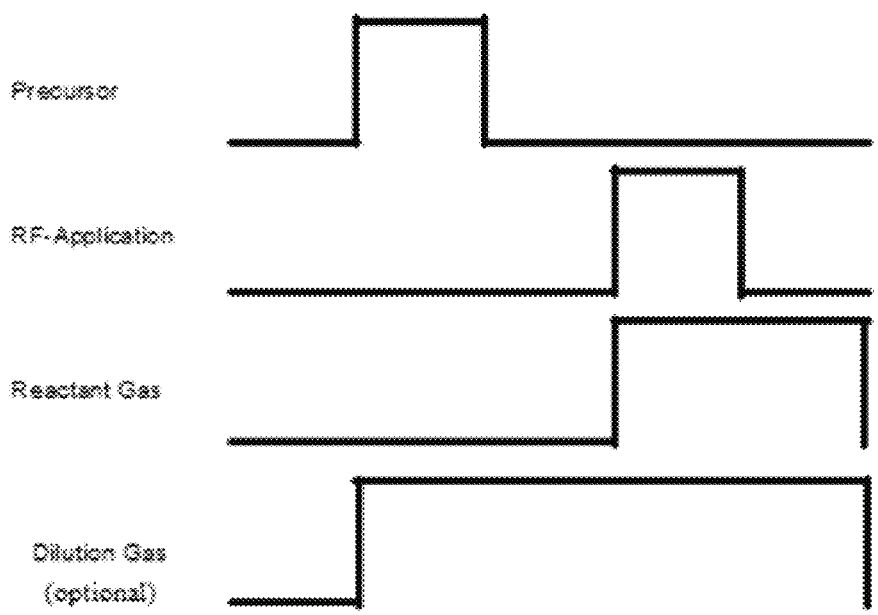
FIG. 2 illustrates process steps of a PEALD method for depositing a dielectric film according to an embodiment of the present invention.
Figure 3:
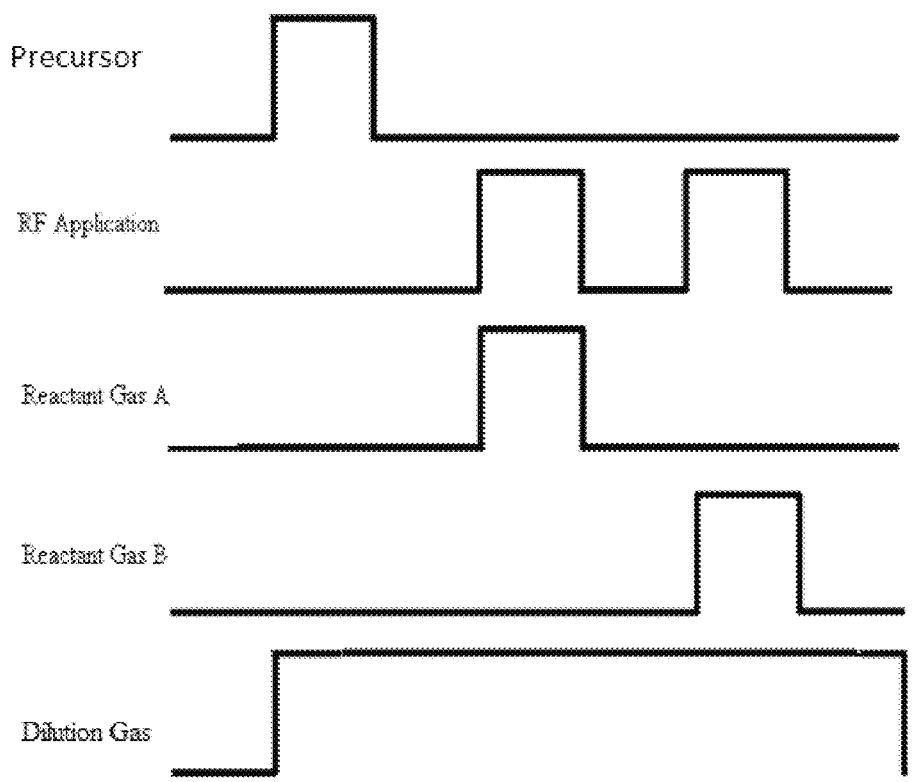
FIG. 3 illustrates process steps of a PEALD method for depositing a dielectric film according to another embodiment of the present invention.
Figure 4:
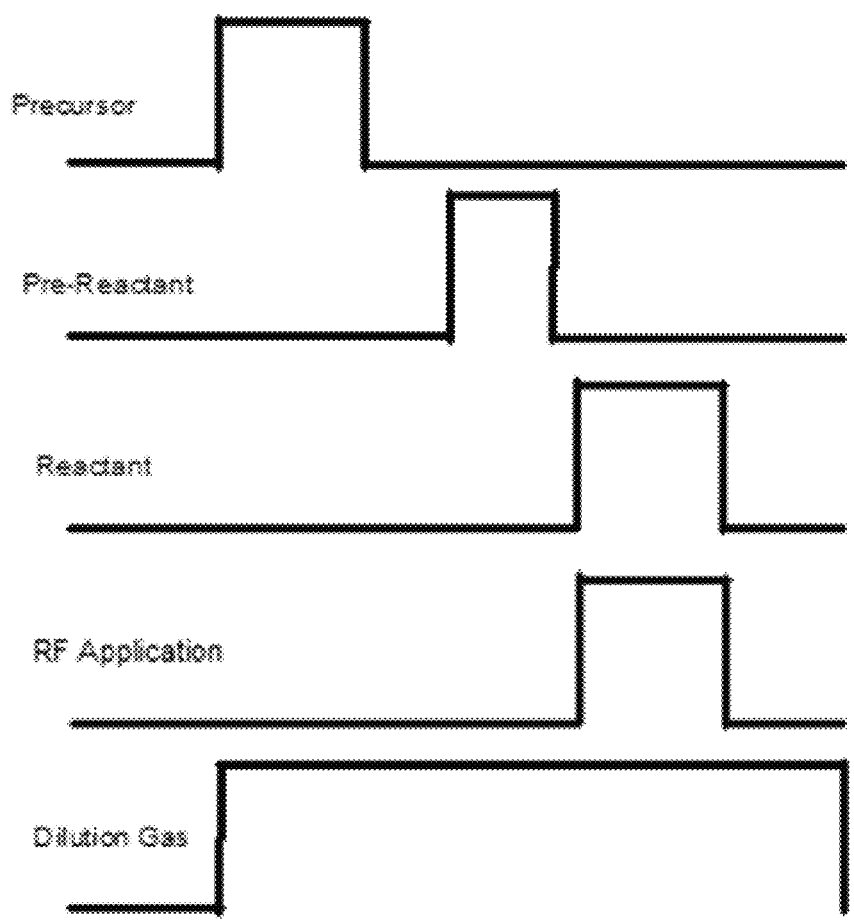
FIG. 4 illustrates process steps of a PEALD method for depositing a dielectric film according to still another embodiment of the present invention.

In any of the disclosed embodiments, any suitable film formation sequences can be employed including, but not limited to, the sequences illustrated in FIGS. 2 to 4; each represents one cycle of the sequence. The cycle can be repeated until a film having a desired thickness is obtained. In some embodiments, the cycles illustrated in FIGS. 2 to 4 and 7 can be used in combination, depending on the desired type of final film.

In FIG. 2 (Sequence 1), a precursor is supplied in a pulse, followed by purging, and then, a reactant gas is supplied in a pulse. RF power is applied only while the reactant gas is being supplied. The continuous supply of a dilution gas functions as purging. Alternatively, after RF power is applied, the supply of the reactant gas can be discontinued, and purging can be conducted. In other words, there are two occurrences of purging; one is immediately after the supply of the precursor, and another is immediately after the application of RF power, and the continuous supply of the reactant gas can function as the first purging step or as the first and second purging steps, wherein separate purging steps can be omitted. A separate purging step can be conducted by supplying a separate purge gas (typically a rare gas) continuously or in pulses while vacuuming is conducted for efficient purging.

In some embodiments, the precursor is supplied using a carrier gas, wherein the precursor is vaporized in a tank under an equilibrium vaporization pressure, and the vaporized precursor is supplied with a carrier gas to a reactor, wherein the flow of the precursor is controlled by the inflow gas pressure (the pressure of gas flowing into the reactor).

In some embodiments, the precursor is supplied together with a secondary precursor, such as hydrocarbon for films having Si—C bonds, in the same pulses.

In Sequence 1, in some embodiments, the following conditions can be employed:
Substrate temperature: 0 to 650° C. (preferably about 50 to about 500° C.)
Precursor pressure: 50 to 1333 Pa (preferably about 100 to about 500 Pa)
Carrier gas (e.g., Ar) flow: 500 to 3000 sccm (preferably about 1000 to about 2000 sccm)
Precursor pulse: 0.1 to 10 seconds (preferably about 0.3 to about 3 seconds)
Purge upon the precursor pulse: 0.1 to 10 seconds (preferably about 0.3 to about 3 seconds)
Purge gas flow: 100 to 2,000 sccm (preferably about 300 to 1,500 sccm)
RF frequency: 13.56 to 60 MHz
RF power: 10 to 1,500 W (preferably about 100 to about 800 W for a 300-mm wafer)
RF power pulse: 0.1 to 15 seconds (preferably about 0.3 to 5 seconds)
Reactant gas flow: 10 to 4,000 sccm (preferably about 200 to 2,000 sccm)
Reactant gas pulse: 0.1 to 10 seconds (preferable about 0.3 to about 3 seconds)
Purge upon the reactant gas pulse: 0.1 to 10 seconds (preferably about 0.3 to about 3 seconds)
Purge gas flow: 100 to 2,000 sccm (preferably about 300 to 1,500 sccm)
Duration of one cycle: 1 to 30 seconds
Number of cycles repeated: 300 to 1,000
Thickness of film: 5 to 30 nm The RF power pulse and the reactant gas pulse are matched in FIG. 2. However, the RF power pulse can be prolonged by, e.g., 10% to 20% after the reactant gas pulse is terminated. In other words, in some embodiments, the above timing can be matched substantially, and need not be matched exactly, in view of process delay.

Figure 7:
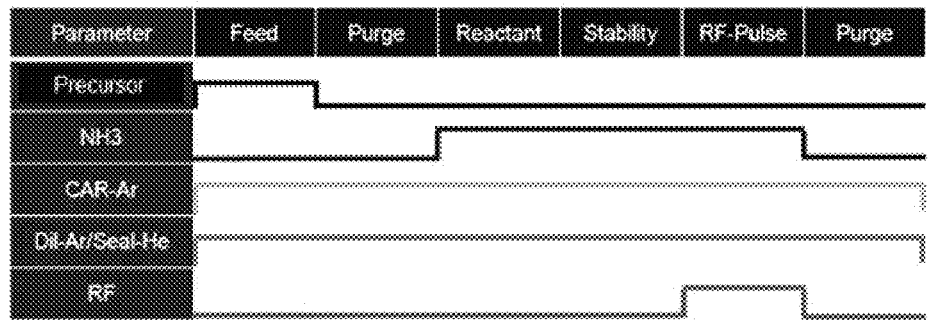
FIG. 7 illustrates process steps of a PEALD method for depositing a dielectric film according to yet another embodiment of the present invention.

In FIG. 7 (Sequence 2), differently from Sequence 1, a carrier gas (e.g., Ar) is continuously supplied, and by switching the routes in pulses, the carrier gas carries a precursor as illustrated in FIG. 5. Further, a reactant gas (e.g., NH3) begins flowing before applying RF power. In a step of "Feed", the carrier gas with the precursor is supplied without supplying the reactant gas and without applying RF power. A dilution gas (e.g., Ar) and a seal gas (e.g., He) are supplied. In a step of "Purge", the supply of the precursor is stopped, while continuously supplying the carrier gas and the dilution/seal gases without applying RF power. By this step, the non-adsorbed precursor is removed from the surface of the substrate. In a step of "Reactant", the supply of the reactant gas begins without supplying the precursor while supplying the carrier gas and the dilution/seal gases without applying RF power. In this step, the flow of the reactant gas is not stable. In a step of "Stability", the reactant gas is continuously supplied until the flow becomes stable while maintaining the other parameters. In a step of "RF-Pulse", the reactant gas is continuously supplied and the flow is stable, and RF power is applied while maintaining the other parameters. In a step of "Purge", the supply of the reaction gas is stopped, and the application of RF power is also stopped, while maintaining the other parameters, i.e., supplying the carrier gas and the dilution/seal gases without supplying the precursor, thereby removing the non-reacted reactant gas from the surface of the substrate. In Sequence 2, the reactant gas is not mixed with the precursor in the reactor before reacting on the surface of the substrate, and RF power is applied when the flow of the reactant gas is stable, thereby significantly reducing the number of particles and improving GPC. In FIG. 7, the steps of "Reactant" and "Stability" are separately indicated; however, these steps can be integrated or considered as one step. In some embodiments, the conditions of Sequence 1 are applicable to Sequence 2, and the conditions different from or additional to those of Sequence 1 are as follows:
Reactant gas pulse ("Reactant"): 0.1 to 10 seconds (preferably about 0.3 to about 3 seconds)
Stability pulse ("Stability"): 1 to 10 seconds (preferably about 2 to about 5 seconds)
RF power pulse ("RF-Pulse"): 0.1 to 10 seconds (preferably about 0.3 to 5 seconds)
Dilution/seal gas flow: 100 to 2,000 sccm (preferably about 300 to 1,500 sccm)

In FIG. 3 (Sequence 3), two reactant gases are used, which are separately supplied in pulses in sequence, between which purging is conducted. RF power is applied while the two reactant gases are supplied, i.e., RF power is applied in two steps and two reactions are performed in one cycle. This sequence is suitable for a film constituted by silicon and two or more other elements, wherein silicon and a first element are supplied by the precursor and the first reactant gas, and a second element is supplied by the second reactant gas. For example, the first reactant gas is $H_2$ and the second reactant gas is $NH_3$, thereby first forming SiC and then nitrizing SiC to form SiCN. Alternatively, the first reactant gas is $NH_3$ and the second reactant gas is $H_2$, thereby first forming SiN and then carbonizing SiN to form SiCN. The conditions used in Sequence 1 can be applied to Sequence 3. A separate purging step can be conducted by supplying a separate purge gas (typically a rare gas) continuously or in pulses while vacuuming is conducted for efficient purging. The "Reactant" and "Stability" steps of Sequence 2 can be applied to Sequence 3.

In FIG. 4 (Sequence 4), as in Sequence 3, two reactant gases are used, but there is one reaction (RF power is applied once in one cycle). Except for supplying a pre-reactant gas (carbonization gas, boronization gas, or nitrization gas), the sequence is similar to Sequence 1 (FIG. 2), and the conditions used in Sequence 1 can be applied to Sequence 4. A separate purging step can be conducted by supplying a separate purge gas (typically a rare gas) continuously or in pulses while vacuuming is conducted, and the separate purging is particularly effective when multiple reactant gases are used. The "Reactant" and "Stability" steps of Sequence 2 can be applied to Sequence 4. Additional conditions are as follows:

Pre-reactant gas pulse: 0.1 to 5 seconds (preferably about 0.3 to about 2 seconds)

Purge between the precursor pulse and the pre-reactant gas pulse: 0.5 to 3 seconds (preferably about 1 to about 2 seconds)

Purge between the pre-reactant gas pulse and RF power application: 0 to 3 seconds (preferably about 0.5 to about 2 seconds).

In some embodiments, the dielectric film has excellent copper diffusion blocking and is used as a copper diffusion blocking layer or a hardmask. In some embodiments, the dielectric film has a high conformality, an improved reflective index, and a turned resistance to chemicals. In order to protect a surface, remove impurities, and improve density and resistance to chemicals, post-formation treatment can be performed in some embodiments. For example, the post-formation treatment can be performed as follows:

Plasma: $H_2$ plasma $H_2$ flow: 10 to 3,000 sccm (preferably about 100 to about 1,000 sccm)

Pressure: 50 to 1,333 Pa (preferably about 100 to about 500 Pa)

Temperature: 100 to 400° C. (preferably about 150 to about 350° C.)

RF power: 10 to 1,500 W (preferably about 100 to about 800 W)

RF frequency: 13.56 MHz to 60 MHz

Duration: 5 to 600 seconds

The disclosed embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE

Figure 6:
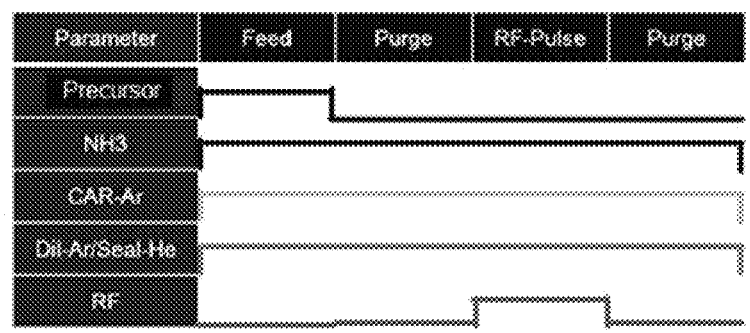
FIG. 6 illustrates process steps of a PEALD method for depositing a dielectric film according to a comparative example.

A dielectric film was formed on a 300-mm substrate having a patterned surface having an aspect ratio of about 2 and an opening width of about 50 nm under the condition shown below using Sequences 5 and 2 illustrated in FIGS. 6 to 7 and the PEALD apparatus illustrated in FIG. 1 with a modification using the flow switching control system illustrated in FIG. 5. The thickness of film was 30 nm for evaluating film properties. The conditions for depositing a film were as follows and are also shown in Table 1.

Sequence 5 (FIG. 6)—Comparative Example:

Precursor inflow pressure: 133-1333 Pa (It depended on vapor pressure of precursor)

Carrier gas (Ar) flow: 2000 sccm

RF frequency: 13.56 MHz

Precursor supply time ("Feed"): 0.1-1 sec supply (It depended on vapor pressure of precursor)

Purge time after precursor pulse ("Purge"): 1 sec

Reactant gas supply time: continuous

Purge time after reactant gas pulse ("Purge"): 1 sec

RF Plasma exciting time ("RF-Pulse"): 1 or 3 sec excite

Sequence 2 (FIG. 7):

Same as in Sequence 1 except:

Reactant gas supply time ("Reactant"): 0.5 sec

Reactant gas stability time ("Stability"): 4 sec

TABLE 1

| | Precursor | SQ | Film | Re | Dil | RF | P | GAP | Tem |
|---|---|---|---|---|---|---|---|---|---|
| Com. 1 | Tetrachlorodimethyldisilane | 5 | SiN | NH3 2SLM | Ar 1SLM | 400 W | 400 Pa | 12 mm | 400° C. |
| Com. 2 | Dichlorotetramethydisilane | 5 | SiN | NH3 2SLM | Ar 1SLM | 400 W | 400 Pa | 12 mm | 400° C. |
| Ex. 1 | Tetrachlorodimethyldisilane | 2 | SiN | NH3 2SLM | Ar 1SLM | 400 W | 400 Pa | 12 mm | 400° C. |
| Ex. 2 | Dichlorotetramethydisilane | 2 | SiN | NH3 2SLM | Ar 2SLM | 400 W | 400 Pa | 12 mm | 400° C. |
| Ex. 3 | Dichlorotetramethydisilane | 2 | SiCN | NH3 1SLM | Ar 1SLM | 100 W | 200 Pa | 15 mm | 400° C. |

SQ: Sequence

Re: Reactant gas

Dil: Dilution gas

RF: RF power

P: Pressure

GAP: A gap between upper and lower electrodes

Tem: A temperature of the substrate

The films obtained above were examined, and the results are shown in Table 2. The number of particles whose size was 0.15 μm or larger was measured using an SP1 manufactured by KLA Tencor Corporation, after the film was deposited.

TABLE 2

|  | Mode | GPC (nm/cycle) | Sidewall coverage (%) | Bottom coverage (%) | In-plane uniformity (1-pI) | Particles (>0.15 um) |
|---|---|---|---|---|---|---|
| Com. 1 | ALD | 0.01 | 92 | 93 | 0.5 | 1000 |
| Com. 2 | ALD | 0.02 | 97 | 99 | 0.4 | 100 |
| Ex. 1 | ALD | 0.04 | 96 | 98 | 0.4 | 30 |
| Ex. 2 | ALD | 0.06 | 99 | 98 | 0.7 | 20 |
| Ex. 3 | ALD | 0.07 | 95 | 96 | 1.0 | 25 |

As shown in Table 2, by separating the precursor pulse and the reactant gas pulse and applying RF power after stabilizing the flow of the reactant gas, the number of particles were drastically reduced while increasing GPC significantly and maintaining high conformality of the film.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method of forming a dielectric film having at least one of Si—N, Si—C, or Si—B bonds on a semiconductor substrate by atomic layer deposition (ALD), which comprises:
   (i) supplying a precursor in a pulse to adsorb the precursor on a surface of a substrate loaded in a reactor, said precursor having at least one Si—C or Si—N bond, at least one of hydrocarbon, and at least two halogens attached to silicon in its molecule;
   (ii) supplying a reactant gas in a pulse over the surface without overlapping the supply pulse of the precursor;
   (iii) reacting the adsorbed precursor with the reactant gas on the surface by applying RF power in a pulse to the reaction gas during step (ii); and
   (iv) repeating steps (i) to (iii) to form a dielectric film having at least one of Si—N, Si—C, or Si—B bonds on the substrate.

2. The method according to claim 1, further comprising purging the reactor between steps (i) and (ii) and between steps (iii) and (iv).

3. The method according to claim 1, wherein in step (iii), RF power is applied after stabilizing a flow of the reactant gas in step (ii).

4. The method according to claim 3, wherein in step (ii), a first time period between starting the supply of the reactant gas and starting the application of RF power is longer than a second time period between starting the application of RF power and ending the application of RF power.

5. The method according to claim 4, wherein the first time period is about 2.3 seconds to about 8 seconds, and the second time period is about 0.3 seconds to about 5 seconds.

6. The method according to claim 1, wherein a temperature of the substrate is controlled at room temperature to 550° C.

7. The method according to claim 1, wherein an inactive gas is continuously supplied throughout steps (i) to (iv).

8. The method according to claim 1, wherein the reactant gas is supplied to the reactor via a mass flow controller (MFC).

9. The method according to claim 1, wherein the precursor has a general formula:

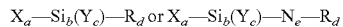

wherein each X is attached to silicon and is independently selected from the group consisting of H, F, Cl, I, and Br, each Y bonds two silicones and is independently selected from the group consisting of $CH_2$, $C_2H_4$, NH, $NCH_2$, and NCl, each R is attached to silicon or nitrogen and is independently selected from the group consisting of $CH_3$, $C_2H_5$, $C_3H_7$, $C(CH_3)_3$, $NH_2$, and $CH_2Cl$, each N in the general formula is attached to silicon, and a, b, c, d, and e are integers.

10. The method according to claim 9, wherein the precursor is at least one compound selected from the group consisting of:

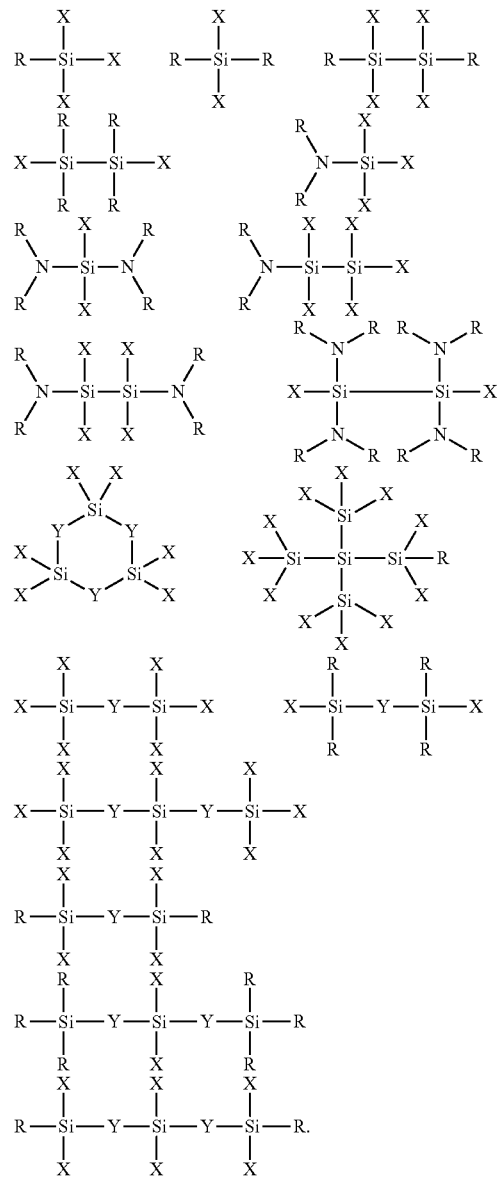

11. The method according to claim 9, wherein in the general formula, the number of X's is ½ or more of the number of Y's and R's in total.

12. The method according to claim 1, wherein the dielectric film is constituted by SiN, SiCN, SiC, SiBN, or SiBCN.

13. The method according to claim 12, wherein the dielectric film is constituted by SiN, SiCN, or SiC, and the reactant gas is selected according to the type of the dielectric film and is at least one selected from the group consisting of $N_2$, $NH_3$, $N_xH_y$, $N_xH_yC_z$, $C_xH_y$, $C_xF_y$, $C_xH_yN_z$, and $H_2$ wherein x, y, and z are integers.

14. The method according to claim 13, wherein the dielectric film is constituted by SiN or SiCN, and the reactant gas is selected according to the type of the dielectric film and is at least one selected from the group consisting of $NH_3$, $N_xH_y$, and $N_xH_yC_z$ wherein x, y, and z are integers.

15. The method according to claim 12, wherein the dielectric film is constituted by SiBN or SiBCN, and the reactant gas is at least one selected from the group consisting of $B_xH_y$ and $B_xH_yC_z$ wherein x, y, and z are integers.

16. The method according to claim 1, wherein the precursor is the only gas which contains silicon.

* * * * *